United States Patent [19]

Bloch et al.

[11] Patent Number: 4,748,367
[45] Date of Patent: * May 31, 1988

[54] CONTACT HEATER FOR PIEZOELECTRIC EFFECT RESONATOR CRYSTAL

[75] Inventors: Martin B. Bloch, Mitchel Field; Bruce Goldfrank, Glen Cove, both of N.Y.

[73] Assignee: Frequency Electronics, Inc., Mitchel Field, N.Y.

[*] Notice: The portion of the term of this patent subsequent to Oct. 20, 2004 has been disclaimed.

[21] Appl. No.: 801,485

[22] Filed: Nov. 25, 1985

Related U.S. Application Data

[63] Continuation-in-part of Ser. No. 738,697, May 28, 1985.

[51] Int. Cl.$^4$ ............................................. H01L 41/08
[52] U.S. Cl. ................................. 310/343; 310/346; 310/353; 310/365; 310/369
[58] Field of Search ............... 310/360, 361, 365, 353, 310/341-344, 346, 367; 219/210, 474, 504, 543

[56] References Cited

U.S. PATENT DOCUMENTS

| | | | |
|---|---|---|---|
| 3,165,651 | 1/1965 | Bechmann | 310/365 |
| 3,201,621 | 8/1985 | Milner | 310/343 |
| 3,202,846 | 8/1965 | Ballato et al. | 310/365 X |
| 3,431,392 | 3/1969 | Garland et al. | 310/343 X |
| 3,478,573 | 11/1969 | King, Jr. | 310/343 X |
| 3,715,563 | 2/1973 | Bloch | 219/210 |
| 3,818,254 | 6/1974 | Persson | 219/210 X |
| 4,091,303 | 5/1978 | Tadataka et al. | 310/343 |
| 4,518,944 | 5/1985 | Faris | 310/343 X |

FOREIGN PATENT DOCUMENTS

| | | | |
|---|---|---|---|
| 0076696 | 7/1978 | Japan | 310/365 |
| 5115710 | 9/1980 | Japan | 310/312 |

OTHER PUBLICATIONS

Lateral-Field Excitation of Quartz Plates, by E. R. Hatch et al., IEEE Ultrasonics Symposium, 1983.

Primary Examiner—Mark O. Budd
Attorney, Agent, or Firm—Amster, Rothstein & Ebenstein

[57] ABSTRACT

A contact heater arrangement is disclosed for a piezoelectric effect crystal resonator. The piezoelectric effect crystal element may be an SC cut quartz crystal disc having electrodes affixed to one side thereof to generate a lateral field in the crystal disc. The contact heater element is applied to the side of the crystal element opposite the side on which the electrodes are affixed. The particular pattern of the heater leaves the center of the crystal element exposed for frequency adjustment purposes. Locating the heating element and electrodes on opposite sides of the crystal element generates a constant temperature which has been found effective to uniformly heat a piezoelectric effect crystal element, and with appropriate control circuitry, allows for temperature stabilization of the crystal element.

8 Claims, 1 Drawing Sheet

U.S. Patent
May 31, 1988
4,748,367
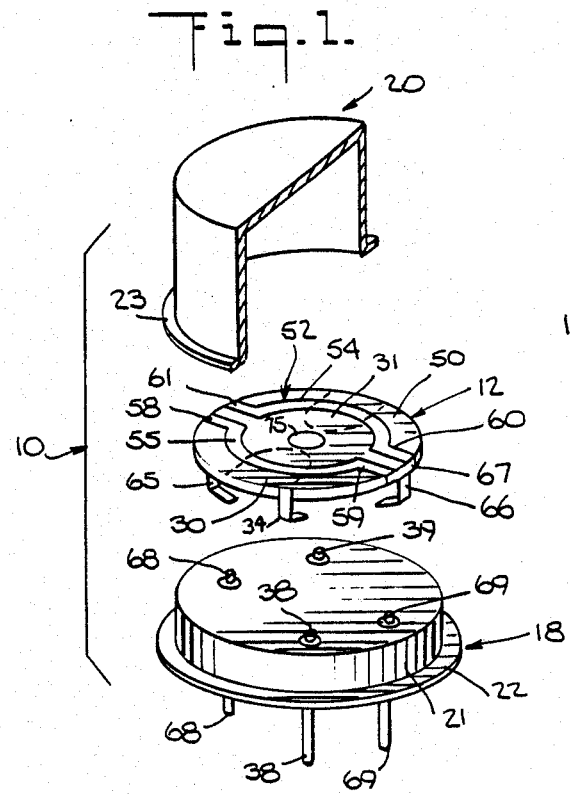
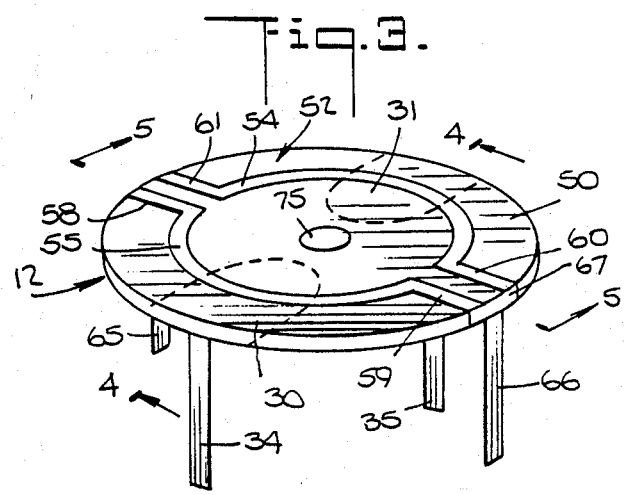
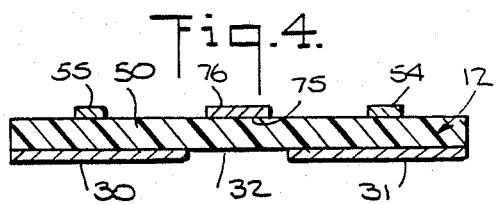
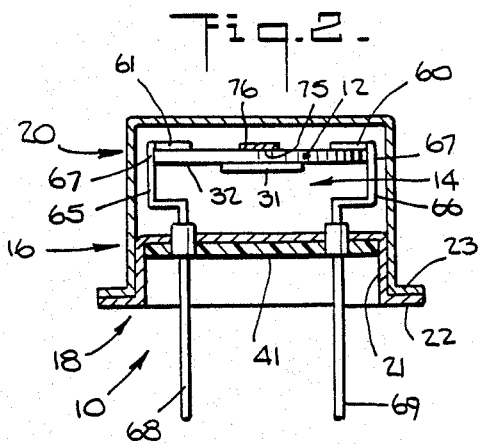
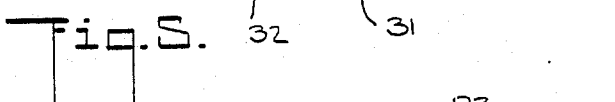
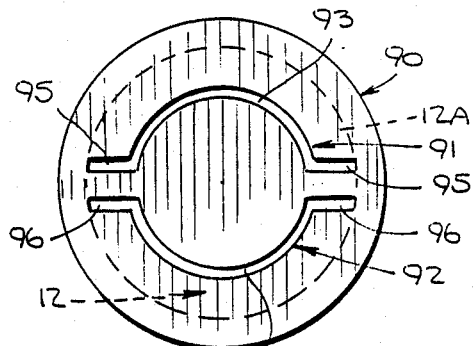
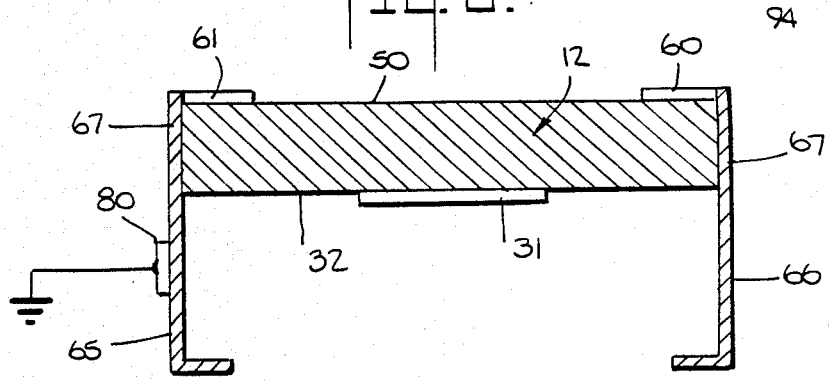

CONTACT HEATER FOR PIEZOELECTRIC EFFECT RESONATOR CRYSTAL

This is a continuation-in-part of application Ser. No. 738,697 filed May 28, 1985 in the names of Arthur W. Warner and Bruce Goldfrank and assigned to the assignee of this Application.

BACKGROUND OF THE INVENTION

The present invention relates generally to piezoelectric effect resonators, and particularly to temperature control of the piezoelectric effect crystal element of such resonators.

U.S. Pat. No. 3,715,563 issued on Feb. 6, 1973 in the name of Martin Bloch, one of the inventors herein, to the assignee of this application discloses a piezoelectric device which includes a piezoelectric effect crystal element disposed in an evacuated chamber. As described in the U.S. Pat. No. 3,715,563, piezoelectric devices such as quartz crystal devices are known to be temperature sensitive and were traditionally placed in high tolerance ovens which maintained the temperature of the devices to a high degree of accuracy. The U.S. Pat. No. 3,715,563 discloses that rather than use conventional ovens, thin films deposited directly on the piezoelectric effect crystal elements can be utilized as electric resistance contact heaters to produce substantially improved results.

In devices of the type disclosed in the U.S. Pat. No. 3,715,563, an electric field is generated in a piezoelectric effect crystal element by means of an exciting signal applied to the crystal element by electrodes disposed opposite each other on both sides of the crystal element. The electrodes are disposed inwardly of the edge of the crystal element and lead contacts are disposed on the crystal element surface extending from a respective electrode outwardly to the edge of the crystal element. Such an arrangement of electrodes generates an electric field directed normal to a major surface of the crystal element, i.e., along the thickness of the crystal element, and is referred to as a "thickness excitation field" or simply a "thickness field". In order to uniformly apply heat to a crystal element having the electrode arrangement described above, the U.S. Pat. No. 3,715,563 discloses an arrangement of a contact heater, electrodes and electrode lead contacts in which the electrode lead contacts on opposed sides of the crystal element are offset and annular contact heater elements are applied to both sides of the crystal element overlapping with each other except in the regions occupied by the lead contacts. As a result of this arrangement, a constant temperature is established in the crystal element even in regions of the crystal element covered by the electrodes and lead contacts, to compensate for varying ambient temperatures.

Recent research has revealed the desirability of generating an electric field in piezoelectric effect crystal elements parallel to a major surface of the crystal element, such a field being referred to as a "lateral excitation field" or simply as a "lateral field". See, for example, U.S. patent application Ser. No. 738,697 filed May 28, 1985. The disclosures of U.S. Pat. No. 3,715,563 and U.S. patent application Ser. No. 738,697 are incorporated herein by reference.

Lateral fields may be generated in piezoelectric effect crystal elements by arranging the electrodes on the same side of the crystal element, as disclosed, for example, in the patent application Ser. No. 738,697. Specifically, the patent application Ser. No. 738,697 discloses the desirability of utilizing an SC cut quartz crystal element with electrodes disposed on the same side of the crystal element for generating a lateral field therein. Although the U.S. Pat. No. 3,715,563 discloses that improved temperature stabilization of a piezoelectric effect device can be realized with a contact heater deposited directly on the piezoelectric effect crystal element, a heater pattern such as the one disclosed in the U.S. Pat. No. 3,715,563 is quite difficult to apply to a lateral field excited crystal element because of the limited space available on the side of the crystal element having the electrodes and also because of the desire to make available portions of the crystal element for adjusting the frequency at which the crystal element vibrates. Thus, applying resistive heater portions to both sides of a crystal element in order to obtain a uniform temperature gradient throughout the crystal element, as disclosed in the U.S. Pat. No. 3,715,563, presented a problem with respect to lateral field excited crystal elements in configuring and locating the heater elements and the electrodes, and connecting leads and supports to the crystal element.

OBJECTS AND SUMMARY OF THE INVENTION

It is an object of the present invention to provide a contact heater for a piezoelectric effect crystal element having its field generating electrodes disposed on the same side of the crystal element.

It is another object of the present invention to provide such a contact heater which permits easy adjustment of the vibrating frequency of the crystal element.

If is another object of the present invention to provide such a contact heater for a piezoelectric effect crystal element which is of simple construction.

In accordance with the present invention, which achieves the above and other objects, a constant temperature is generated in a piezoelectric effect crystal element by an electric contact heater coupled to only one side of the crystal element, thereby leaving the other side of the crystal element free for lateral field generating electrodes.

In a specific embodiment, the piezoelectric effect crystal element is generally plate-like having spaced opposed sides and electrodes coupled to only a first of the opposed sides for generating an electric field in the crystal element, and the electric heater is coupled to only a second of the opposed sides of the crystal element for heating it. The electric heater comprises a thin film of resistive material extending in a generally annular pattern generally centralized on the second side of the crystal, leaving exposed a substantial area of the second side of the crystal element within the annular pattern. The central area of the crystal element on the side thereof to which the heater is coupled is therefore available for adjusting the frequency of vibration of the crystal element, as described in the patent application Ser. No. 738,697.

Means are provided to couple power to the electric heater and circuit means are provided to regulate the power supplied to the heater in response to temperature so that the temperature of the piezoelectric effect crystal element may be stabilized.

In order to reduce heat transfer to and from the piezoelectric effect crystal element, it is mounted in a housing having an evacuated chamber and the electrical conductors which supply power to the heater are made from relatively poor thermal conductors.

The above and other objects, aspects, features and advantages of the present invention will be more readily perceived from the following description of the preferred embodiments taken with the accompanying drawings and appended claims.

BRIEF DESCRIPTION OF THE DRAWINGS

The present invention is illustrated by way of example and not limitation in the figures of the accompanying drawings in which like numbers indicate like parts, and in which:

FIG. 1 is an exploded perspective view, partially in cross section, of a quartz crystal resonator including the electric heater of the invention mounted to the quartz crystal disc of the resonator;

FIG. 2 is a vertical cross-sectional view of the resonator of FIG. 1;

FIG. 3 is an enlarged perspective view of the quartz crystal disc of the resonator of FIG. 1 with the electric heater and field-generating electrodes affixed thereto;

FIG. 4 is a cross-sectional view of the quartz crystal disc of FIG. 3 taken along lin 4—4 of FIG. 3;

FIG. 5 is a cross-sectional view of the quartz crystal resonator of FIG. 3 taken along the line 5—5 thereof;

FIG. 6 is a schematic cross-sectional view of part of the resonator of FIG. 1 showing mounting of a thermistor therein; and FIG. 7 is a top view of a mask used to apply the electric heater to the quartz crystal disc of the resonator of FIG. 1.

DESCRIPTION OF THE PREFERRED EMBODIMENTS

Referring first to FIGS. 1 and 2, a piezoelectric effect resonator 10 is depicted which includes a quartz crystal element 12 mounted in an evacuated chamber 14 (FIG. 2) of a housing 16 comprising a base 18 and a cap 20. The base 18 has a skirt 21 and shoulder 22 which conform to the shoulder 23 and internal diameter of the cap 20 such that the internal chamber 14 can be evacuated and the base 18 and cap 20 joined together with an air tight seal.

Referring to FIGS. 1–3, the quartz crystal element 12 may be an SC cut quartz crystal disc having generally semicircular shaped electrodes 30,31 affixed to one side 32 thereof for generating an electric field in the crystal element 12, as described in the patent application Ser. No. 738,697. Specifically, the quartz crystal disc may be a doubly rotated SC cut quartz crystal disc defined YXwlt$\phi\Theta\Psi$ in accordance with IEEE Standard on Piezoelectricity No. 176-1978, where $\phi$ is from about 20° to about 30°, preferably about 22°, $\theta$ is from about 33° to about 35°, preferably about 34°, and $\Psi$ is about 0°. For improved results as described in the patent application Ser. No. 738,697, an electric field is generated in the crystal disc having a field direction which forms a positive angle with the rotated Z axis, i.e., with the Z' axis of the doubly rotated SC cut crystal disc of approximately $+110° \pm 50°$. Such an electric field is preferably generated by the electrode arrangement depicted in the drawings of this application. Further details relating to resonators employing SC cut quartz crystal elements may be found in the patent application Ser. No. 738,697.

An exciting signal is supplied to the electrodes 30,31 by means of leads 34,35 coupled respectively to electrodes 30,31. The leads 34,35 extend to contact pins 38,39 which pass through air tight openings in the bottom wall of the base 18. In the usual fashion, a glass material 41 (FIG. 2) is provided to ensure an air tight seal at the point where the pins 38,39 pass through the base 18.

Applied to the opposite side 50 of the quartz disc 12 is a heater 52 in the form of a thin film resistive layer in a generally annular pattern. The resistive layer heater 52 includes two thin film strips 54,55 each of which extends generally in a semicircle having its center coaxial with the center of the quartz disc. For ease of applying the resistive strips 54,55 and connecting leads thereto, each includes respective linear portions 58,59, 60,61 extending to the peripheral edge of the quartz disc 12, with the linear portions 58,61 and 59,60 of the respective strips being adjacent to but spaced from each other. Leads 65 and 66 are attached to the peripheral edge of the quartz disc 12 to supply electrical power to the resistive strips 54,55. Adjacent linear portions 58,61 and 59,60 of the resistive strips 54,55 are electrically connected together at the peripheral edge of the quartz disc 12 by a respective peripheral lead portion 67, and a lead 65,66 is connected to each peripheral lead portion 67 at the periphery of the quartz disc 12. This arrangement connects the resistive strips 54,55 in parallel. A series connection of the resistive strips can be accomplished by connecting linear portions 59,60 together, as shown in the drawings, but connecting each of linear portions 58,61 to independent leads rather than to a single common lead. The leads 65,66 are connected to contact pins 68,69 in the base of the housing and brought out as described for contact pins 38,39. The contact pins 38,39, 69,69 and the leads 34,35, 65,66 support the crystal disc 12 in the housing 10.

The contact pins 38,39 are connected to a signal source for exciting the quartz crystal disc 12 to generate an electric field therein, and the contact pins 68,69 are connected to a source of electrical power and/or a control or regulating circuit, as described, for example, in the U.S. Pat. No. 3,715,563.

Referring to FIGS. 3–5, the electrodes 30,31 are configured and located to generate a lateral field in the quartz crystal disc 12 as described, for example, in the patent application Ser. No. 738,697. The frequency of vibration of the quartz disc 12 may be adjusted, as described in the patent application Ser. No. 738,697, by depositing material or removing material from the side 50 of the quartz disc 12 opposite to the side 32 on which the electrodes 30,31 are disposed. In order to permit such deposition or removal of material, the resistive strips 54,55 are configured to leave the central portion 75 of the quartz disc 12 exposed. It is preferred that tuning be effected by depositing material 76 on the central portion 75 of the disc 12, as shown in FIGS. 2 and 4.

The annular pattern of the heater 52 provides heater portions extending on the quartz disc 12 essentially without leaving a gap on the surface of the quartz disc 12 between the heater portions. It has been found that this annular pattern creates a constant temperature in the entire quartz disc 12. Patterns other than the annular pattern shown which include resistive portions disposed extending about a substantial part of the quartz disc 12 essentially without gaps while leaving the center of the disc free may also be used, although the annular pattern is presently preferred.

In some environments of use, the ambient temperature may be relatively stable so that the temperature of the quartz disc 12 may be maintained constant simply by maintaining the electrical power supplied to the heater 52 constant. In other environments, the ambient temperature may vary so that it will be necessary to vary the electrical power supplied to the heater 52 to maintain the quartz disc 12 at a constant temperature. Accordingly, temperature sensing means are employed within the housing 16 to continuously measure the temperature of the quartz disc 12. In FIG. 6 there is shown in schematic form a thermistor 80 affixed to one of the leads (e.g., lead 65) connected to the heater 52. The thermistor 80, which may also be placed in other locations, is connected in an external circuit as described in the U.S. Pat. No. 3,715,563, for example.

In order to reduce heat transfer between the inside and the outside of the housing 16, the leads 65,66 connected to the heater 52 are made from material having relatively poor thermal conductivity but good electrical conductivity. For example, relatively good electrical conductors having a thermal conductivity of less than about 173 BTU/hr per sq. ft. per °F./in include titanium alloys, stainless steels and nickel, titanium alloys including aluminum and vanadium being preferred.

Referring now to FIG. 7, a mask 90 is depicted which may be used to apply the resistive layer heater 52 in an annular pattern to a quartz crystal blank 12A. Although the resistive layer heater 52 may be applied in a closed circle on the face of the crystal blank 12A, it is difficult to accomplish because a two-piece mask or a more complex arrangement is required in which parts of the mask defining a closed annular strip are connected together. The mask 90 depicted in FIG. 7 includes two slotted openings or slits 91,92 each including semicircular annular portions 93,94 and opposed linear portions 95,96, corresponding to the pattern of the heater 52 depicted in FIG. 3. The mask 90 is made of a single piece and therefore is easily supported with respect to the crystal blank 12A to which the resistive layer is to be applied. The resistive layer heater 52 may be made of a thin film resitive material such as palladium, platinum or nickel.

A quartz crystal disc 12 having electrodes 30,31 affixed to a single side 32 and an electric heater 52 applied to the opposite side 50 thereof in accordance with the invention may be fabricated as follows. A quartz crystal blank is cut from quartz crystal material, finished and cleaned to obtain quartz crystal blank 12A, and then disposed adjacent to the mask 90 for deposition of the heater 52 which is deposited on side 50 using high vacuum sputtering technology. The quartz crystal disc is then separated from the mask 90 and disposed adjacent to an electrode plating mask (not shown), and the electrodes 30,31 are plated onto the opposite side 32 of the quartz crystal disc 12 using high vacuum evaporation techniques. Thereafter, the support leads 34,35 and 65,66 are connected to the heater 52 and electrodes 30,31 using a cold welded header. The quartz crystal disc 12 with the electrode and heater structure affixed thereto is then mounted to pins 38,39 and 68,69. The thermistor 80 is mounted to the heater support lead 65 and the other side of the thermistor is connected to the header (not shown) for the crystal element using a gold wire. The final frequency of vibration of the quartz crystal disc 12 is then adjusted by the addition of mass or removal of mass from the area 75 of the heater side 50 of the quartz crystal disc 12, using evaporation deposition techniques in the case of applying more mass. Finally, the housing 16 for the resonator is sealed in ultra-high vacuum using cold weld techniques. The use of ultrahigh vacuum will give the best aging characteristics while obtaining excellent thermal insulation for very low power operation.

Since quartz crystal elements are capable of vibrating simultaneously in more than one mode, and since the precise frequency of vibration in both modes is temperature dependent, it is possible to utilize the frequency of vibration of one of the modes in a resonator circuit while utilizing the frequency of vibration of another mode in thermometry circuitry. Preferably, the temperature at which the quartz crystal element is operated and the modes are selected so that the slope of the frequency/temperature curve of the mode used for the resonator at the operating point is relatively flat while the slope of the frequency/temperature curve of the mode used for thermometry at the operating point is relatively steep. For example, for a doubly rotated SC cut quartz crystal element as described in the patent application Ser. No. 738,697, with a turnover at 75° C., which is operated at 75° C., the slope of the frequency/temperature curve for the C mode is less than about 0.1 Hz/°C. and for the B mode it is about 150 Hz/°C. Thus, the B mode may be used for thermometry where relatively small changes in temperature are manifested by relatively large changes in frequency.

Certain changes and modifications to the embodiments disclosed herein will be readily apparent to those skilled in the art. For example, the contact heater disclosed herein may be used with piezoelectric effect elements of various materials and shapes. It is the applicants' intention to cover by the claims all modifications and changes which can be made to the embodiments chosen herein for purposes of disclosure which do not depart from the spirit and scope of the invention.

What is claimed is:

1. A piezoelectric effect resonator comprising a housing defining an evacuated interior chamber, a generally plate-like crystal element of piezoelectric material having opposed sides mounted in the chamber, electrodes coupled to only a first of the opposed sides of the crystal element for generating an electric field therein, means for coupling electrical signals to the electrodes from the exterior of the housing, an electric heater comprising a thin film layer of resistive material coupled to only a second of the opposed sides of the crystal element, and a pair of leads of a material of good electrical conductivity and a thermal conductivity of less than 173 BTU/hr per sq. ft. per °F./in. coupled to the layer of resistive material and to the exterior of the housing for coupling electrical power to the layer of resistive material.

2. The resonator according to claim 1 wherein the electric heater comprises a thin film layer of resistive material extending in a generally annular pattern generally centralized on the second side of the crystal element leaving exposed a substantial area of the second side generally in the center thereof.

3. The resonator according to claim 2 wherein the thin film electric heater comprises a first thin film strip of resistive material extending approximately in a semicircle on the second side of the crystal element and a second thin film strip of resistive material spaced from the first strip extending approximately in a semicircle on the second side opposite the first strip, the first and second strips together defining the generally annular pattern.

4. The resonator according to claim 3 wherein the two strips are electrically connected in parallel.

5. A piezoelectric effect resonator comprising a housing defining an interior chamber, a double rotated SC cut plate-like quartz crystal element having opposed major sides disposed in the chamber, an X' axis forming an angle $\phi$ of from about 20° to about 30° with a YZ plane and a Z' axis forming an angle $\phi$ of from about 33° to about 35° with an XY plane, and electrodes coupled to only a first of the major sides of the plate-like quartz crystal element for applying an electric field thereto having a field direction which forms a positive angle with the Z' axis of approximately $+110° \pm 50°$, means for coupling electrical signals to the electrodes from the exterior of the housing, an electric heater coupled to a second of the major sides of the crystal element, and means for coupling electrical power to the heater from the exterior of the housing.

6. The resonator according to claim 5 wherein the electric heater comprises a thin film layer of resistive material extending in a generally annular pattern generally centralized on the second major side of the crystal element leaving exposed a substantial area of the second major side generally in the center thereof.

7. The resonator according to claim 6 wherein the electric heater comprises a first thin film strip of resistive material extending approximately in a semicircle on the second major side of the crystal element and a second thin film strip of resistive material spaced from the first strip approximately in a semicircle on the second major side opposite the first strip, the first strip and the second strip together defining the generally annular pattern.

8. The resonator according to claim 7 wherein the two strips are electrically connected in parallel.

* * * * *